United States Patent
Li et al.

(10) Patent No.: US 8,349,626 B2
(45) Date of Patent: Jan. 8, 2013

(54) CREATION OF LOW-RELIEF TEXTURE FOR A PHOTOVOLTAIC CELL

(75) Inventors: Zhiyong Li, Los Altos, CA (US); David Tanner, San Jose, CA (US); Gopalakrishna Prabhu, San Jose, CA (US); Mohamed H. Hilali, Sunnyvale, CA (US)

(73) Assignee: GTAT Corporation, Nashua, NH (US)

( * ) Notice: Subject to any disclaimer, the term of this patent is extended or adjusted under 35 U.S.C. 154(b) by 400 days.

(21) Appl. No.: 12/729,878

(22) Filed: Mar. 23, 2010

(65) Prior Publication Data

US 2011/0237013 A1    Sep. 29, 2011

(51) Int. Cl.
*H01L 21/00* (2006.01)
*H01L 31/0232* (2006.01)

(52) U.S. Cl. ............... 438/19; 438/73; 136/256
(58) Field of Classification Search .......... None
See application file for complete search history.

(56) References Cited

U.S. PATENT DOCUMENTS

| | | |
|---|---|---|
| 3,480,473 A | 11/1969 | Tanos |
| 4,084,985 A | 4/1978 | Evans, Jr. |
| 4,137,123 A * | 1/1979 | Bailey et al. ............ 438/753 |
| 4,144,096 A | 3/1979 | Wada et al. |
| 4,171,561 A | 10/1979 | Bainard et al. |
| 4,171,997 A | 10/1979 | Irmler |
| 4,200,472 A | 4/1980 | Chappel et al. |
| 4,240,842 A | 12/1980 | Lindmayer |
| 4,338,481 A | 7/1982 | Mandelkorn |
| 4,450,472 A | 5/1984 | Tuckerman et al. |
| 4,499,658 A | 2/1985 | Lewis |
| 4,578,526 A | 3/1986 | Nakano et al. |
| 4,830,038 A | 5/1989 | Anderson et al. |
| 4,836,861 A | 6/1989 | Peltzer et al. |

(Continued)

FOREIGN PATENT DOCUMENTS

JP    2001077044 A    3/2001

(Continued)

OTHER PUBLICATIONS

Agarwal et at. in "efficient production of silicon-on-insulator films by co-implantation of He+ with H+", Amer. Inst. of Physics, vol. 72, num. 9, pp. 1086-1088, Mar. 1998.

(Continued)

*Primary Examiner* — Kevin M Picardat
*Assistant Examiner* — Pamela E Perkins
(74) *Attorney, Agent, or Firm* — The Mueller Law Office, P.C.

(57) ABSTRACT

A novel method is described to create low-relief texture at a light-facing surface or a back surface of a photovoltaic cell. The peak-to-valley height and average peak-to-peak distance of the textured surface is less than about 1 microns, for example less than about 0.8 micron, for example about 0.5 microns or less. In a completed photovoltaic device, average reflectance for light having wavelength between 375 and 1010 nm at a light-facing surface with this texture is 6 percent or less, for example about 5 percent or less, in some instances about 3.5 percent. This texture is produced by forming an optional oxide layer at the surface, lightly buffing the surface, and etching with a crystallographically selective etch. Excellent texture may be produced by etching for as little as twelve minutes or less. Very little silicon, for example about 0.3 mg/cm² or less, is lost at the textured surface during this etch.

19 Claims, 10 Drawing Sheets

U.S. PATENT DOCUMENTS

| | | | |
|---|---|---|---|
| 4,897,123 | A | 1/1990 | Mitsui |
| 5,034,068 | A | 7/1991 | Glenn et al. |
| 5,057,163 | A | 10/1991 | Barnett et al. |
| 5,273,911 | A | 12/1993 | Sasaki et al. |
| 5,279,682 | A | 1/1994 | Wald et al. |
| 5,374,564 | A | 12/1994 | Bruel |
| 5,626,688 | A | 5/1997 | Probst et al. |
| 5,723,366 | A | 3/1998 | Suzuki et al. |
| 5,966,620 | A | 10/1999 | Sakaguchi et al. |
| 5,985,742 | A | 11/1999 | Henley et al. |
| 6,048,411 | A | 4/2000 | Henley et al. |
| 6,107,213 | A | 8/2000 | Tayanaka |
| 6,146,979 | A | 11/2000 | Henley et al. |
| 6,184,111 | B1 | 2/2001 | Henley et al. |
| 6,190,937 | B1 | 2/2001 | Nakagawa et al. |
| 6,207,890 | B1 | 3/2001 | Nakai et al. |
| 6,225,192 | B1 | 5/2001 | Aspar et al. |
| 6,229,165 | B1 | 5/2001 | Sakai et al. |
| 6,262,358 | B1 | 7/2001 | Kamimura et al. |
| 6,331,208 | B1 | 12/2001 | Nishida et al. |
| 6,403,877 | B2 | 6/2002 | Katsu |
| 6,500,690 | B1 | 12/2002 | Yamagishi et al. |
| 6,518,596 | B1 | 2/2003 | Basore |
| 6,530,653 | B2 | 3/2003 | Le et al. |
| 6,534,382 | B1 | 3/2003 | Sakaguchi et al. |
| 6,563,133 | B1 | 5/2003 | Tong |
| 6,690,014 | B1 | 2/2004 | Gooch et al. |
| 6,825,104 | B2 | 11/2004 | Horzel et al. |
| 6,858,462 | B2 | 2/2005 | Zaidi et al. |
| 7,019,339 | B2 | 3/2006 | Atwater, Jr. et al. |
| 7,056,815 | B1 | 6/2006 | Weng et al. |
| 7,238,622 | B2 | 7/2007 | Atwater, Jr. et al. |
| 7,462,774 | B2 | 12/2008 | Roscheisen et al. |
| 8,039,396 | B2 | 10/2011 | Nishimura et al. |
| 2002/0132449 | A1 | 9/2002 | Iwasaki et al. |
| 2003/0134489 | A1 | 7/2003 | Schwarzenbach et al. |
| 2004/0200520 | A1 | 10/2004 | Mulligan et al. |
| 2004/0206390 | A1 | 10/2004 | Bhattacharya |
| 2005/0000561 | A1 | 1/2005 | Baret et al. |
| 2006/0021565 | A1 | 2/2006 | Zahler et al. |
| 2006/0208341 | A1 | 9/2006 | Atwater, Jr. et al. |
| 2007/0135013 | A1 | 6/2007 | Faris |
| 2007/0235074 | A1 | 10/2007 | Henley et al. |
| 2007/0277874 | A1 | 12/2007 | Dawson-Elli et al. |
| 2008/0006319 | A1* | 1/2008 | Bettge et al. ............... 136/244 |
| 2008/0023061 | A1 | 1/2008 | Clemens et al. |
| 2008/0070340 | A1 | 3/2008 | Borrelli et al. |
| 2008/0160661 | A1 | 7/2008 | Henley |
| 2008/0179547 | A1 | 7/2008 | Henley |
| 2008/0188011 | A1 | 8/2008 | Henley |
| 2009/0061557 | A1 | 3/2009 | Akiyama et al. |
| 2009/0142874 | A1 | 6/2009 | Arai |
| 2009/0194162 | A1 | 8/2009 | Sivaram et al. |
| 2009/0233394 | A1 | 9/2009 | Batres et al. |
| 2009/0293931 | A1* | 12/2009 | Petti ............... 136/244 |
| 2010/0029034 | A1 | 2/2010 | Nishimoto |
| 2010/0087030 | A1 | 4/2010 | Kim |
| 2010/0252110 | A1* | 10/2010 | Yago et al. ............... 136/261 |
| 2011/0237013 | A1 | 9/2011 | Li et al. |
| 2011/0272625 | A1 | 11/2011 | Wijekoon et al. |
| 2012/0060915 | A1 | 3/2012 | Chan |

FOREIGN PATENT DOCUMENTS

| | | | |
|---|---|---|---|
| JP | 2003017723 A | 1/2003 | |
| JP | 2007250575 A | 9/2007 | |

OTHER PUBLICATIONS

Amin, Nowshad et al., "Highly Efficient 1 Micron Thick CdTe Solar Cells with Textured TCOs", 2001, Solar Energy Materials & Solar Cells, 67, pp. 195-201.

Bergmann, et al. "Thin film solar cells on glass by transfer of monocrystalline Si films", 1999, International Journal of Photoenergy, ,vol. 1, pp. 1-5.

Brendel, Rolf, "Thin-film crystalline silicon mini-modules using porous Si for layer transfer", 2004, Solar Energy 77, pp. 969-982.

De Ceuster et al., "Low Cost, high volume production of >22% efficiency silicon solar cells," Proc. 22nd EUPVSEC, 2007, p. 816-819.

Extended European Search Report ffiled on Feb. 21, 2011 for EPO Application No. 09152012.2.

Extended European Search Report filed on Feb. 21, 2011 for EPO Application No. 09152007.2.

Fuller and Lane, Plasma Etching, Rochester Institue of Technology Microelectronic Engineering, May 15, 2006.

Griggs et al., "Design Approaches and Materials Processes for Ultrahigh Efficiency Lattice Mismatched Multi-junction Solar Cells," Proc. 4th WCPEC, Waikola, HA, 2006.

Kim et al, "Improved thermal stability of Ni silicide on Si (100) through reactive deposition of Ni," J. Vac. Sci. Tech. B 21, 319 (2003).

Mulligan et al., "Manufacture of Solar Cells with 21% Efficiency," http://www.sunpowercorp.com/Smarter-Solar/The-SunPower-Advantage/~/media/Downloads/smarter_solar/bmpaper.ashx, Jun. 2004.

Mulligan et al., "Reducing Silicon Consumption by Leveraging Cell Efficiency." Proc. 21st EUPVSEC, 2006, pp. 1301-1302.

Murarka, Silicides for VLSI Applications, Academic Press, New York, 1983.

Nolan et al., Modeling of agglomeration in polycrystalline thin films: Application to TiSi2 on a silicon substrate, J. Appl. Phys. 45, 720 (1992).

Poortmans, Jeff et al., "Thin Film Solar Cells: Fabrication, Characterization and applications", 2006, John Wiley & Sons Ltd, p. 72.

Rinke, T.J., et al., "Quasi-monocrystalline silicon for thin-film devices", May 1999, Applied Physics A, DOI 10.1007/s003399900078 , pp. 705-707.

Ruby et al, RIE-Texturing of Multicrystalline Silicon Solar Cells, University Center of Excellence for Photovoltaics Conference Papers, Jun. 2006, Georgia Institute of Technology.

Saadatmand et al., "Radiation Emission from Ion Implanters When Implanting Hydrogen and Deuterium," Proc. 1998 Intl. Conf. on Ion Implantation Tech., pp. 292-295, 1999.

Seidel et al., Anisotropic Etching of Crystalline Silicon in Alkaline Solutions, The Electrochemical Society, Inc., Nov. 1990, pp. 3612-3626, vol. 137, No. 11.

Singh, Jasprit; Semiconductor Devices: Basic Principles: Chapter 7: John Wiley 2001.

Taguchi et al., "An approach for the higher efficiency of HIT cells," Proc. IEEE-31, 31st IEE Photovoltaics Spec. Conf., Orlando, USA, Jan. 2005.

U.S. Appl. No. 12/026,530, filed Feb. 5, 2008, entitled "Method to Form a PHotovoltaic Cell Comprising Thin Lamina".

U.S. Appl. No. 12/057,265, filed Mar. 27, 2008, entitled "Method to Form a Photovoltaic Cell Comprising a Thin Lamina Bonded to a Discrete Receiver Element".

U.S. Appl. No. 12/122,108, filed May 16, 2008, entitled "Ion Implanter for Photovoltaic Cell Fabrication".

U.S. Appl. No. 12/130,241, filed May 30, 2008, entitled "Aysmmetric Surface Texturing for use in a PHotovoltaic Cell and Method of Making".

U.S. Appl. No. 12/189,158, filed Aug. 10, 2008, entitled "Photovoltaic Cell Comprising a Thin Lamina Having a Rear Junction and Method of Making".

U.S. Appl. No. 12/339,032, filed Dec. 18, 2008, entitled "Method for Making a Photovoltaic Cell Comprising Contact Regions Doped Through a Lamina".

Zhao et al., "Twenty-four percent efficient silicon solar cells with double layer antireflection coatings and reduced resistance loss," Appl Phys. Lett. 66 (26) Jun. 1995.

* cited by examiner

Prior Art

Fig. 1

Embodiment of 12/026530

Fig. 2a

Embodiment of 12/026530

Fig. 2b

Embodiment of 12/026530

Fig. 2c

Embodiment of 12/026530

Fig. 2d

Prior Art

Fig. 3a

Prior Art

Fig. 3b

Prior Art

Fig. 4a

Prior Art

Fig. 4b

Prior Art

CREATION OF LOW-RELIEF TEXTURE FOR A PHOTOVOLTAIC CELL

BACKGROUND OF THE INVENTION

The invention relates to methods of making low-relief texture at the surface of a thin lamina for use in a photovoltaic cell.

If the light-facing surface of a photovoltaic cell is perfectly planar, a high proportion of incident light may be reflected from the surface rather than entering the cell to be absorbed and converted to electric current. A planar reflective back surface will also tend to reflect light back out of the cell. Texturing the light-facing surface, the back surface, or both surfaces of a photovoltaic cell such that they are not perfectly planar will tend to refract or reflect incident light in a way that will generally improve conversion efficiency of the cell.

SUMMARY OF THE PREFERRED EMBODIMENTS

The present invention is defined by the following claims, and nothing in this section should be taken as a limitation on those claims. In general, the invention is directed to low-relief texture for use in a photovoltaic cell and methods of making such texture.

A first aspect of the invention provides for a method to texture a surface of a photovoltaic cell, the method comprising: buffing a first surface of a silicon body; etching the buffed first surface; and fabricating the photovoltaic cell, wherein the first surface is a light-facing surface in the photovoltaic cell, wherein, after the etching step, at least fifty percent of the first surface has a peak-to-valley height less than about one micron and an average peak-to-peak distance of less than about one micron, and wherein, in the completed photovoltaic cell, average reflectance for light having wavelength between 375 and 1010 nm at the light-facing surface is no more than about five percent.

Another aspect of the invention provides for a method to texture a surface of a photovoltaic cell, the method comprising: implanting ions in a silicon body to define a cleave plane; cleaving a silicon lamina from the silicon body at the cleave plane, creating a cleaved surface; buffing the cleaved surface; etching the buffed cleaved surface; and fabricating the photovoltaic cell, wherein the cleaved surface is a light-facing surface in the photovoltaic cell, wherein, after the etching step, at least fifty percent of the light-facing surface has a peak-to-valley height less than about one micron and an average peak-to-peak distance of less than about one micron, and wherein, in the completed photovoltaic cell, average reflectance for light having wavelength between 375 and 1010 nm at the light-facing surface is no more than about five percent.

Each of the aspects and embodiments of the invention described herein can be used alone or in combination with one another.

The preferred aspects and embodiments will now be described with reference to the attached drawings.

DETAILED DESCRIPTION OF THE PREFERRED EMBODIMENTS

Figure 1:
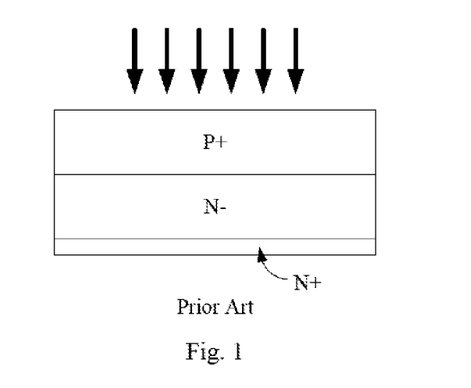
FIG. 1 is a cross-sectional view of a prior art photovoltaic cell.

A conventional prior art photovoltaic cell includes a p-n diode; an example is shown in FIG. 1. A depletion zone forms at the p-n junction, creating an electric field. Incident photons (incident light is indicated by arrows) will knock electrons from the valence band to the conduction band, creating free electron-hole pairs. Within the electric field at the p-n junction, electrons tend to migrate toward the n region of the diode, while holes migrate toward the p region, resulting in current, called photocurrent. Typically the dopant concentration of one region will be higher than that of the other, so the junction is either a p+/n- junction (as shown in FIG. 1) or a n+/p- junction. The more lightly doped region is known as the base of the photovoltaic cell, while the more heavily doped region, of opposite conductivity type, is known as the emitter. Most carriers are generated within the base, and it is typically the thickest portion of the cell. The base and emitter together form the active region of the cell. The cell also frequently includes a heavily doped contact region in electrical contact with the base, and of the same conductivity type, to improve current flow. In the example shown in FIG. 1, the heavily doped contact region is n-type.

Figure 2A:
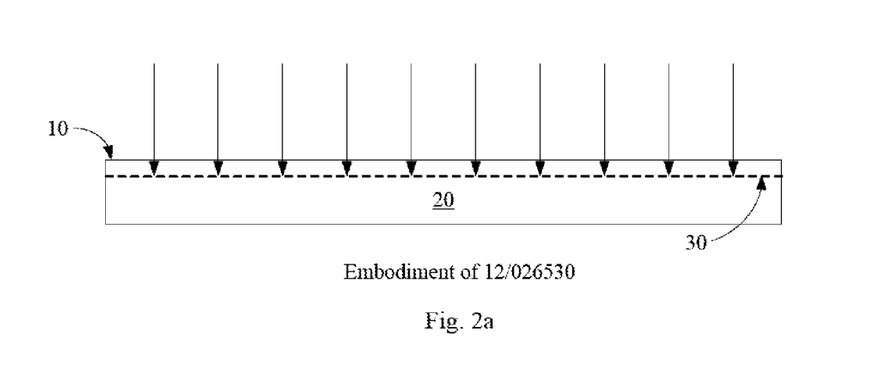
FIGS. 2a-2d are cross-sectional views of stages of fabrication of a photovoltaic cell formed according to an embodiment of U.S. patent application Ser. No. 12/026,530.
Figure 2B:
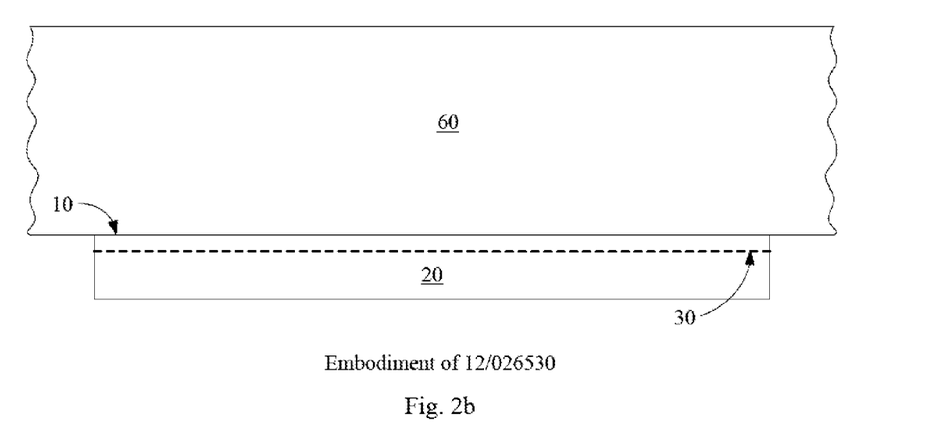
Figure 2C:
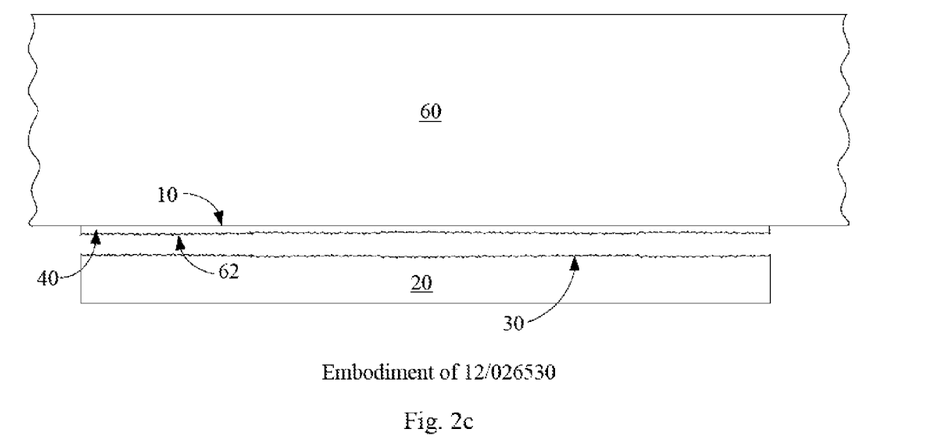
Figure 2D:
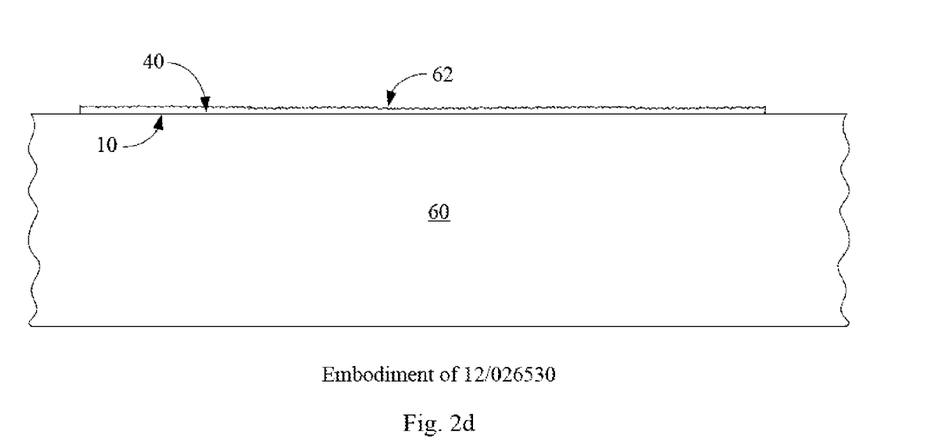

Sivaram et al., U.S. patent application Ser. No. 12/026,530, "Method to Form a Photovoltaic Cell Comprising a Thin Lamina," filed Feb. 5, 2008, owned by the assignee of the present invention and hereby incorporated by reference, describes fabrication of a photovoltaic cell comprising a thin semiconductor lamina formed of non-deposited semiconductor material. Referring to FIG. 2a, in embodiments of Sivaram et al., a semiconductor donor wafer 20 is implanted through first surface 10 with one or more species of gas ions, for example hydrogen and/or helium ions. The implanted ions define a cleave plane 30 within the semiconductor donor wafer. As shown in FIG. 2b, donor wafer 20 is affixed at first surface 10 to receiver 60. Referring to FIG. 2c, an anneal causes lamina 40 to cleave from donor wafer 20 at cleave plane 30, creating second surface 62. In embodiments of Sivaram et al., additional processing before and after the cleaving step forms a photovoltaic cell comprising semiconductor lamina 40, which is between about 0.2 and about 100 microns thick, for example between about 0.2 and about 50 microns, for example between about 1 and about 20 microns thick, in some embodiments between about 1 and about 10 microns thick, though any thickness within the named range is possible. FIG. 2d shows the structure inverted, with receiver 60 at the bottom, as during operation in some embodiments. Receiver 60 may be a discrete receiver element having a maximum width no more than 50 percent greater than that of donor wafer 10, and preferably about the same width, as described in Herner, U.S. patent application Ser. No. 12/057,265, "Method to Form a Photovoltaic Cell Comprising a Thin Lamina Bonded to a Discrete Receiver Element," filed on Mar. 27, 2008, owned by the assignee of the present application and hereby incorporated by reference. Alternatively, a plurality of donor wafers may be affixed to a single, larger receiver, and a lamina cleaved from each donor wafer.

Using the methods of Sivaram et al., photovoltaic cells, rather than being formed from sliced wafers, are formed of thin semiconductor laminae without wasting silicon through kerf loss or by fabrication of an unnecessarily thick cell, thus reducing cost. The same donor wafer can be reused to form multiple laminae, further reducing cost, and may be resold after exfoliation of multiple laminae for some other use.

Figure 3A:
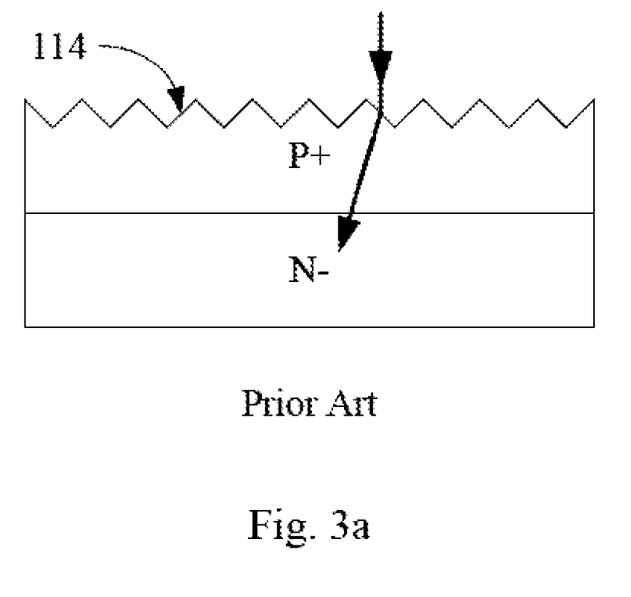
FIGS. 3a and 3b are cross-sectional views illustrating texturing the front or back surface of a prior art photovoltaic cell to increase the travel length of light within the cell.
Figure 3B:
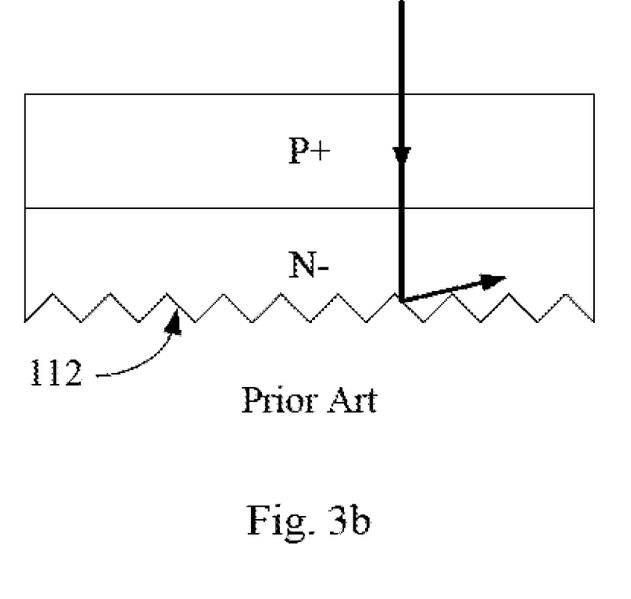

Some incident light falling on the light-facing surface in a photovoltaic cell will be reflected at that surface, and will never enter the cell. Reducing reflectance at the light-facing surface cell thus improves performance. Referring to FIG. 3a, it is well known to texture a light-facing surface 114 of a photovoltaic cell, reducing reflection and causing incident light to be refracted into the cell, as shown. Light may enter the cell, but may pass all the way through the cell without creating any electron-hole pairs, failing to generate any photocurrent and reducing the efficiency of the cell. To avoid allowing light to escape, typically the back surface of the cell is reflective, so that light that passes through the cell is reflected back into the cell from the back surface. Back surface 112 may be textured, as in FIG. 3b, changing the angle of light upon reflection. Either technique serves to increase travel length of light within the cell, improving cell efficiency; often both front and back surfaces are textured. Ideally surface texturing will reduce reflectance at the light-facing surface and alter the path of light so that all light is internally reflected, and none escapes.

Figure 4A:
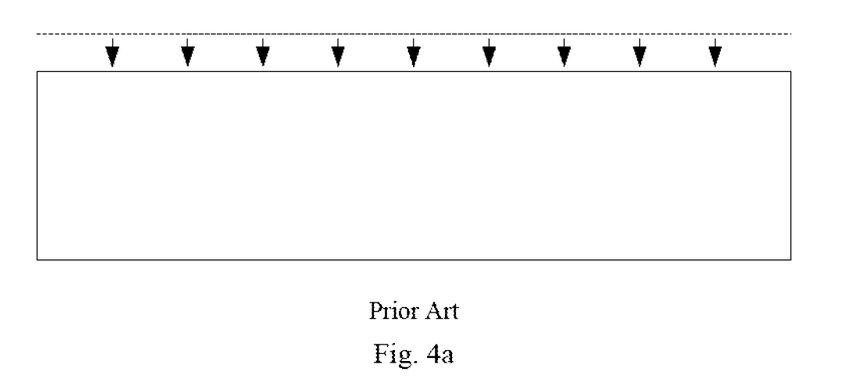
FIGS. 4a-4c are cross-sectional views illustrating conventional creation of surface texture for a prior art photovoltaic cell.
Figure 4B:
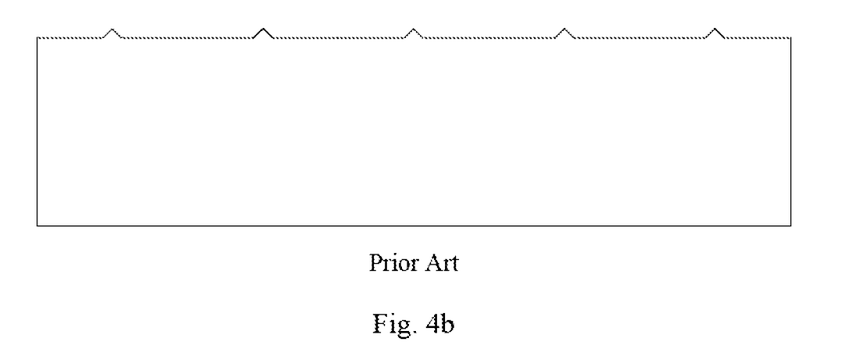
Figure 4C:
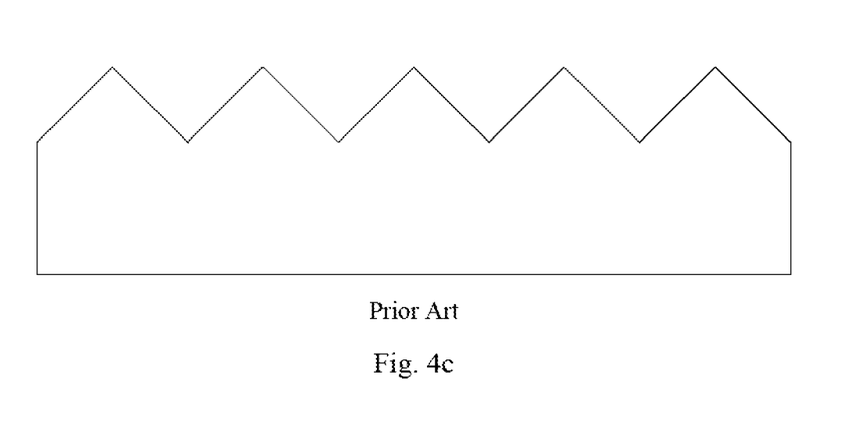

In photovoltaic cells formed from monocrystalline wafers, it is conventional to create surface texture by etching the wafers with a crystallographically selective etchant. Selective etchants including KOH, NaOH, and tetramethylammonium hydroxide (TMAH), for example, etch the (100) and (110) crystallographic planes of silicon at a higher rate than the (111) plane. In a conventional etch step using an etchant such as KOH or TMAH at the surface of a (100) oriented silicon wafer the surface initially retreats uniformly without forming any texture, as shown in FIG. 4a. After some time, selective etching begins at relatively sparsely distributed points, and, as shown in FIG. 4b, pyramids gradually begin to form. After sufficient time, the pyramids meet, and the etch rate slows. About 30 minutes or more of etching at the surface of a standard (100)-oriented wafer produces the regular pyramids of FIG. 4c, which will typically have a peak-to-valley height on the order of a few microns to tens of microns. Such a surface, as described earlier, decreases reflection from the light-facing surface and increases travel length within the body of the photovoltaic cell.

In the present application, a method is described to create surface texture for use in a photovoltaic cell. The surface texture of the present invention can be achieved with much shorter etching time, with much less silicon loss, than the conventional process. The resulting surface has low reflectance, and in general the relief produced is small, having an average peak-to-valley height of less than about 1 micron, generally less than about 0.8 microns, for example 0.5 microns or less. Peak-to-peak distance is small as well, less than about 1 micron, generally less than about 0.8 microns, for example 0.5 microns or less.

This novel method can be performed either to texture a surface of a conventional silicon wafer having a thickness of 100 microns, 200 microns, or more; or to texture a surface of a thin lamina cleaved from a thicker body such as a silicon wafer, the lamina having a thickness between about 0.5 and about 20 microns, for example between about 0.5 and about 10 microns, as described by Sivaram et al., earlier incorporated. The sub-micron relief created by this method is particularly well-suited to the thin lamina produced by the method of Sivaram. Clearly it is impractical to use a conventional texturing method, which typically consumes ten microns or more of silicon, in order to create surface texture at the surface of a lamina which may have a pre-texturing thickness of 10 microns, 5 microns, or less. Regardless of the thickness of the initial silicon body, the method of the present invention provides the advantage of reduced etch time.

In embodiments of the present invention, a surface of a silicon body is first cleaned in a conventional cleaning step, for example by a hydrofluoric acid (HF) dip. Next, in some embodiments, a silicon oxide layer is grown on the silicon surface. This oxide can be allowed to grow simply by exposing the surface to atmosphere at room temperature, or can be chemically or thermally grown. The oxide should be very thin, for example 100 angstroms or less, in most instances 50 angstroms or less. As will be understood, some silicon is consumed at the silicon surface to form the silicon oxide layer. In some embodiments, creation of the silicon oxide layer may be omitted.

Next, without removing the silicon oxide layer, a buffing step is performed at the silicon surface. This buffing step is performed with very little pressure applied, for example 0.5 psi or less. Buffing is performed with a lightly textured material. The powder-free latex used in a standard textured cleanroom glove is an appropriate buffing agent. Buffing is very brief, preferably with only one or two light passes performed over the silicon surface.

Next the buffed surface is exposed to a crystallographically selective etchant, such as KOH or TMAH. As is conventional, a surfactant, such as isopropyl alcohol (IPA) is included. The etch is allowed to proceed, then stopped after a predetermined period of time, which will vary with the etchant formulation and etch conditions, as will be described in greater detail later. In most embodiments, etching will take place for about twelve minutes or less. Very little silicon is lost during this etch. By weight, silicon loss per unit area is generally a total of about 0.3 mg/cm$^2$ or less at a textured surface.

Etching at the buffed silicon surface creates low-relief texture. At least 50 percent, and generally at least 95 percent, of first surface 15 has peak-to-valley height less than about one micron, for example less than about 0.8 micron, in some instances less than about 0.5 microns; and has average peak-to-peak distance less than about one micron, for example less than about 0.8 micron, in some instances less than about 0.5 micron. A photovoltaic cell is fabricated (specific fabrication examples will be provided) in which the textured surface is a light-facing surface, or, in some embodiments, a back surface. In the finished device, average reflectance for light having wavelength between 375 and 1010 nm at a light-facing surface is low, about 6 percent or less, for example about 5 percent or less. In some embodiments, reflectance is about 3.5 percent or less.

It has been found that immediately following buffing as described herein, and before etching, no mechanical damage to the buffed surface is apparent in a scanning electron microscope (SEM) image. It has also been found that if an anneal step is performed between the buffing step and the etching step, the advantageous texture of the present invention is not produced. Without wishing to be bound by any specific theory, it is suspected that the buffing step introduces atomic-level disturbance or strain to the surface at relatively uniform distribution. These many points of disturbance or strain may serve to provide initiation points for etching so that selective etching begins rapidly, uniformly, and densely. Silicon dioxide is harder than silicon, and the thin oxide, when formed and not removed before the buffing step, may serve as a mild abrasive during buffing.

It is possible that buffing may open small, uniformly distributed apertures in the oxide, where each oxide becomes a nucleation point during etching. The silicon dioxide layer may additionally serve to prevent scratches, or to otherwise lessen or distribute damage to the surface that might tend to create non-uniform etching. Recall that in embodiments using the methods of Sivaram et al. to create a lamina, a first surface of a silicon donor body is implanted with ions to define a cleave plane, then bonded or adhered to a receiver element. A lamina is cleaved from the donor body at the cleave plane, remaining adhered to the receiver element. The cleaving step creates a second surface of the lamina. In some embodiments, texture is created at the cleaved surface of the lamina using methods according to the present invention. A photovoltaic cell is fabricated, where the cleaved, textured surface serves as a light-facing surface in the completed device during normal operation.

Figure 5:
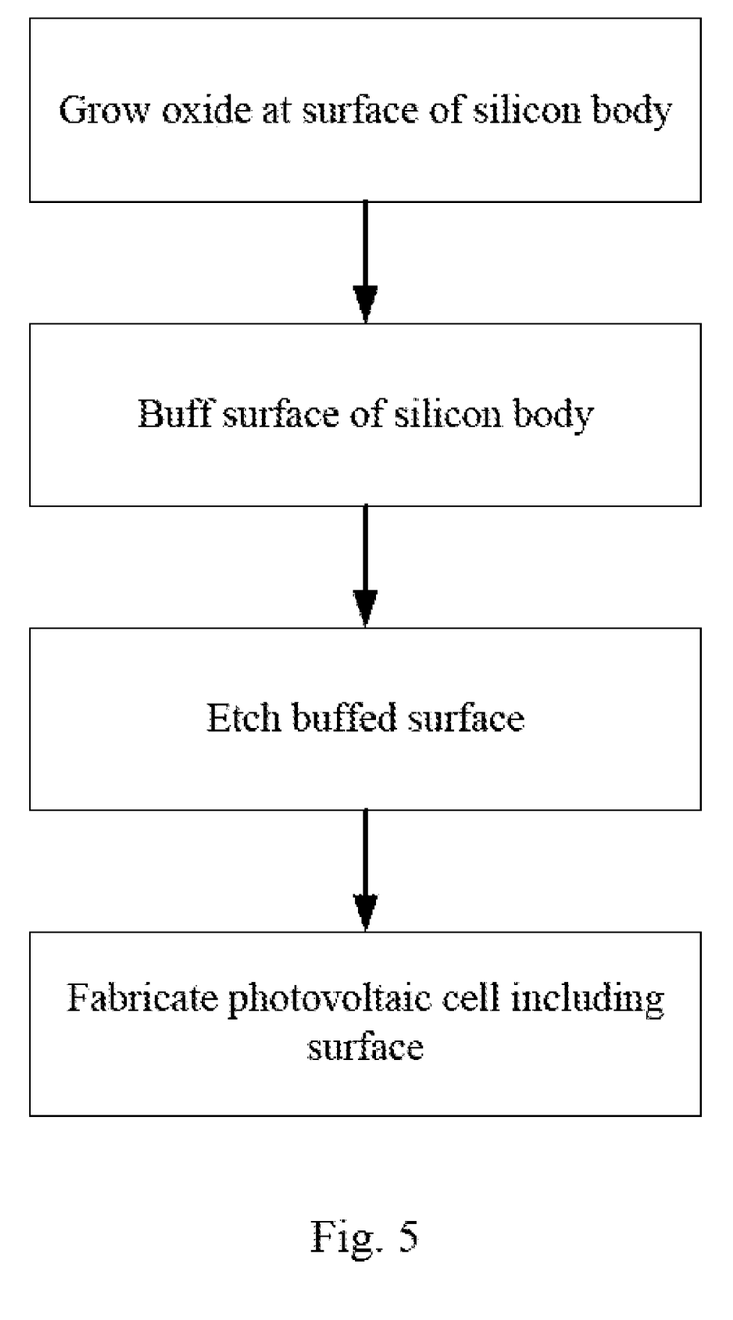
FIG. 5 is a flow chart summarizing steps in a method to create a textured surface according to an embodiment of the present invention.

To summarize, what has been described is a method to texture a surface of a photovoltaic cell, the method comprising: buffing a first surface of a silicon body; etching the buffed first surface; and fabricating the photovoltaic cell, wherein the first surface is a light-facing surface in the photovoltaic cell, wherein, after the etching step, at least fifty percent of the first surface has a peak-to-valley height less than about one micron and an average peak-to-peak distance of less than about one micron, and wherein, in the completed photovoltaic cell, average reflectance for light having wavelength between 375 and 1010 nm at the light-facing surface is no more than about five percent. An oxide can be formed before the buffing step, and not removed before buffing. These steps are summarized in FIG. 5. In some embodiments, the silicon body is a thin lamina having a thickness between about 0.5 micron and about 10 microns. In other embodiments, the silicon body can be a wafer, for example having a thickness of about 100 microns or more.

Use of these methods creates a photovoltaic cell comprising a silicon body having a light-facing surface having a textured portion, the textured portion having a peak-to-valley height less than about 1 micron and an average peak-to-peak distance of less than about 1 micron, wherein the textured portion is at least fifty percent of the area of the light-facing surface, wherein, in the completed cell, average reflectance for light having wavelength between 375 and 1010 nm is less than about five percent.

For clarity, a detailed example of a photovoltaic assembly including a receiver element and a lamina having thickness between 0.2 and 100 microns, in which low-relief surface texture is created according to embodiments of the present invention will be provided. For completeness, many materials, conditions, and steps will be described. It will be understood, however, that many of these details can be modified, augmented, or omitted while the results fall within the scope of the invention.

EXAMPLE

The process begins with a donor body of an appropriate semiconductor material. An appropriate donor body may be a monocrystalline silicon wafer of any practical thickness, for example from about 200 to about 1000 microns thick. Typically the wafer has a <100> orientation, though wafers of other orientations may be used. In alternative embodiments, the donor wafer may be thicker; maximum thickness is limited only by practicalities of wafer handling. Alternatively, polycrystalline or multicrystalline silicon may be used, as may microcrystalline silicon, or wafers or ingots of other semiconductor materials, including germanium, silicon germanium, or III-V or II-VI semiconductor compounds such as GaAs, InP, etc. In this context the term multicrystalline typically refers to semiconductor material having grains that are on the order of a millimeter or larger in size, while polycrystalline semiconductor material has smaller grains, on the order of a thousand angstroms. The grains of microcrystalline semiconductor material are very small, for example 100 angstroms or so. Microcrystalline silicon, for example, may be fully crystalline or may include these microcrystals in an amorphous matrix. Multicrystalline or polycrystalline semiconductors are understood to be completely or substantially crystalline. It will be appreciated by those skilled in the art that the term "monocrystalline silicon" as it is customarily used will not exclude silicon with occasional flaws or impurities such as conductivity-enhancing dopants.

The process of forming monocrystalline silicon generally results in circular wafers, but the donor body can have other shapes as well. For photovoltaic applications, cylindrical monocrystalline ingots are often machined to an octagonal cross section prior to cutting wafers. Wafers may also be other shapes, such as square. Square wafers have the advantage that, unlike circular or hexagonal wafers, they can be aligned edge-to-edge on a photovoltaic module with minimal unused gaps between them. The diameter or width of the wafer may be any standard or custom size. For simplicity this discussion will describe the use of a monocrystalline silicon wafer as the semiconductor donor body, but it will be understood that donor bodies of other types and materials can be used.

Figure 6A:
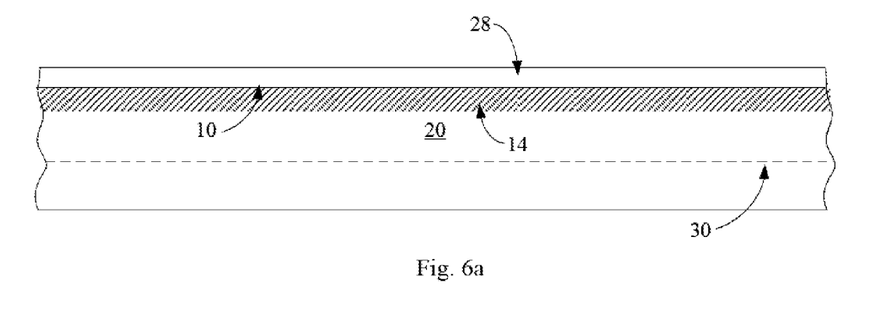
FIGS. 6a-6e are cross-sectional views illustration fabrication of a photovoltaic cell textured according to an embodiment of the present invention.

Referring to FIG. 6a, donor wafer 20 is a monocrystalline silicon wafer which is lightly to moderately doped to a first conductivity type. The present example will describe a relatively lightly n-doped wafer 20 but it will be understood that in this and other embodiments the dopant types can be reversed. Wafer 20 may be doped to a concentration of between about $1\times10^{15}$ and about $1\times10^{18}$ dopant atoms/cm$^3$, for example about $1\times10^{17}$ dopant atoms/cm$^3$. Donor wafer 20 may be, for example, solar- or semiconductor-grade silicon.

First surface 10 may be heavily doped to some depth to the same conductivity type as wafer 20, forming heavily doped region 14; in this example, heavily doped region 14 is n-type. This doping step can be performed by any conventional method, including diffusion doping. Any conventional n-type dopant may be used, such as phosphorus or arsenic. Dopant concentration may be as desired, for example at least $1\times10^{18}$ dopant atoms/cm$^3$, for example between about $1\times10^{18}$ and $1\times10^{21}$ dopant atoms/cm$^3$. Doping and texturing can be performed in any order, but since most texturing methods remove some thickness of silicon, it may be preferred to form heavily doped n-type region 14 following texturing. Heavily doped region 14 will provide electrical contact to the base region in the completed device.

Next, in the present embodiment, a dielectric layer 28 is formed on first surface 10. As will be seen, in the present example first surface 10 will be the back of the completed photovoltaic cell, and a conductive material is to be formed on dielectric layer 28. The reflectivity of the conductive layer to be formed is enhanced if dielectric layer 28 is relatively thick. For example, if dielectric layer 28 is silicon dioxide, it may be between about 1000 and about 1500 angstroms thick, while if dielectric layer 28 is silicon nitride, it may be between about 700 and about 800 angstroms thick, for example about 750 angstroms. This layer may be grown or deposited by any suitable method. A grown oxide or nitride layer 28 passivates first surface 10 better than if this layer is deposited. In some embodiments, a first thickness of dielectric layer 28 may be grown, while the rest is deposited.

In the next step, ions, preferably hydrogen or a combination of hydrogen and helium, are implanted into wafer 20 to define cleave plane 30, as described earlier. This implant may be performed using the implanter described in Parrill et al., U.S. patent application Ser. No. 12/122,108, "Ion Implanter for Photovoltaic Cell Fabrication," filed May 16, 2008; or those of Ryding et al., U.S. patent application Ser. No. 12/494,268, "Ion Implantation Apparatus and a Method for Fluid Cooling," filed Jun. 30, 2009; or of Purser et al. U.S. patent application Ser. No. 12/621,689, "Method and Apparatus for Modifying a Ribbon-Shaped Ion Beam," filed Nov. 19, 2009, all owned by the assignee of the present invention and hereby incorporated by reference. The overall depth of cleave plane 30 is determined by several factors, including implant energy. The depth of cleave plane 30 can be between about 0.2 and about 100 microns from first surface 10, for example between about 0.5 and about 20 or about 50 microns, for example between about 1 and about 10 microns or between about 1 or 2 microns and about 5 or 6 microns.

Figure 6B:
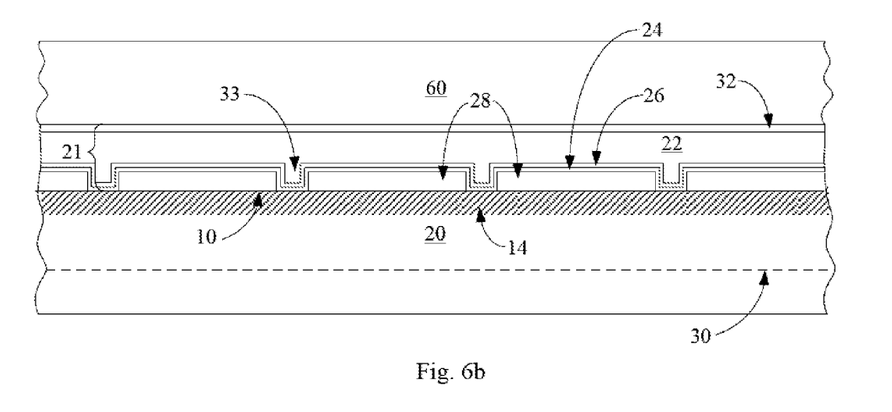

Turning to FIG. 6b, after implant, openings 33 are formed in dielectric layer 28 by any appropriate method, for example by laser scribing or screen printing. The size of openings 33 may be as desired, and will vary with dopant concentration, metal used for contacts, etc. In one embodiment, these openings may be about 40 microns square. Note that figures are not to scale.

A cobalt or titanium layer 24 is formed on dielectric layer 28 by any suitable method, for example by sputtering or thermal evaporation. This layer may have any desired thickness, for example between about 100 and about 400 angstroms, in some embodiments about 200 angstroms thick or less, for example about 100 angstroms. Layer 24 may be cobalt or titanium or an alloy thereof, for example, an alloy which is at least 90 atomic percent cobalt or titanium. Cobalt layer 24 is in immediate contact with first surface 10 of donor wafer 20 in vias 33; elsewhere it contacts dielectric layer 28. In alternative embodiments, dielectric layer 28 is omitted, and titanium layer 24 is formed in immediate contact with donor wafer 20 at all points of first surface 10.

Non-reactive barrier layer 26 is formed on and in immediate contact with cobalt layer 24. This layer is formed by any suitable method, for example by sputtering or thermal evaporation. Non-reactive barrier layer 26 may be any material, or stack of materials, that will not react with silicon, is conductive, and will provide an effective barrier to the low-resistance layer to be formed in a later step. Suitable materials for non-reactive barrier layer include TiN, TiW, W, Ta, TaN, TaSiN, Ni, Mo, Zr, or alloys thereof. The thickness of non-reactive barrier layer 26 may range from, for example, between about 100 and about 3000 angstroms, for example between about 500 and about 1000 angstroms. In some embodiments this layer is about 700 angstroms thick.

Low-resistance layer 22 is formed on non-reactive barrier layer 26. This layer may be, for example, cobalt, silver, or tungsten or alloys thereof. In this example low-resistance layer 22 is cobalt or an alloy that is at least 90 atomic percent cobalt, formed by any suitable method. Cobalt layer 22 may be between about 5000 and about 20,000 angstroms thick, for example about 10,000 angstroms (1 micron) thick.

In this example an adhesion layer 32 may be formed on low-resistance layer 22. Adhesion layer 32 is a material that will adhere to receiver element 60, for example titanium or an alloy of titanium, for example an alloy which is at least 90 atomic percent titanium. In alternative embodiments, adhesion layer 32 can be a suitable dielectric material, such as Kapton or some other polyimide. In some embodiments, adhesion layer 32 is between about 100 and about 2000 angstroms, for example about 400 angstroms. Cobalt layer 24, nonreactive barrier layer 26, low-resistance layer 22, and adhesion layer 32 make up intermetal stack 21.

Next a receiver element adhered to the donor wafer is provided. This receiver element 60 will provide structural support to the thin lamina to be cleaved from donor wafer 20 at cleave plane 30. As described by Sivaram et al., this receiver element can be a rigid or semi-rigid material, such as glass, metal, semiconductor, etc., which is bonded to donor wafer 20. In this example the intermetal stack 21 is disposed between donor wafer 20 and the receiver element. In other embodiments, the receiver element can be a preformed sheet of polyimide, as described in Agarwal et al., U.S. patent application Ser. No. 12/493,195, "Method to Form a Thin Semiconductor Lamina Adhered to a Flexible Substrate," filed Jun. 27, 2009, owned by the assignee of the present application and hereby incorporated by reference. Alternatively, a receiver element can be constructed by applying or accreting a material or stack of materials to first surface 10, or, in the example described, to a layer on or above first surface 10, such as adhesion layer 32. Agarwal et al., for example, describe forming a receiver element by applying liquid polyimide to an intermetal stack formed on a donor wafer, then curing the liquid polyimide to form a polyimide receiver element. A constructed receiver element could be formed of other suitable materials as well. This receiver element is formed from the material or stack of materials thus applied, and will have a final thickness of at least 50 microns.

A receiver element 60 is provided adhered to donor wafer 20, with dielectric layer 28, titanium layer 24, non-reactive barrier layer 26, low-resistance layer 22, and adhesion layer 32 intervening. Receiver element 60 may be a laminate structure, including layers of different materials.

Figure 6C:
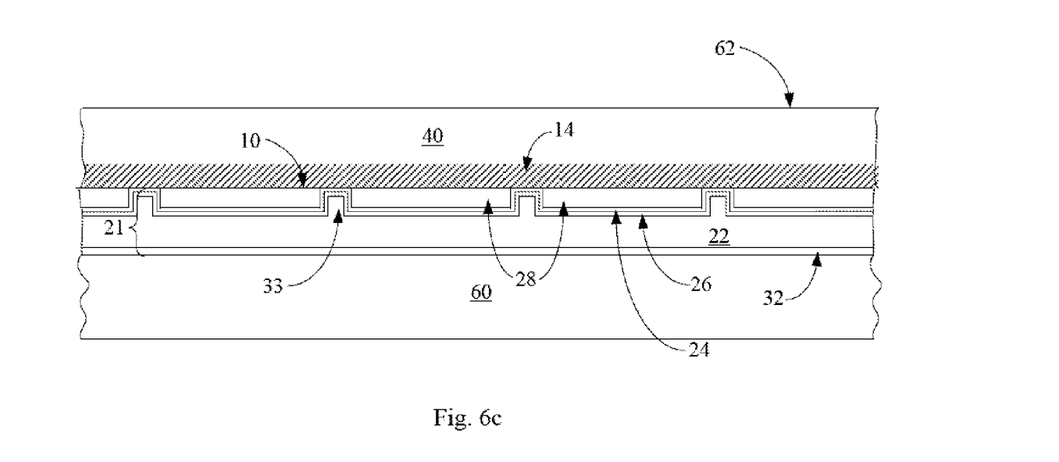

Referring to FIG. 6c, which shows the structure inverted with receiver element 60 on the bottom, a thermal step causes lamina 40 to cleave from the donor wafer at the cleave plane. Cleaving is achieved in this example by exfoliation, which may be achieved at temperatures between, for example, about 350 and about 650 degrees C. In general, exfoliation proceeds more rapidly at higher temperature. The thickness of lamina 40 is determined by the depth of cleave plane 30. In many embodiments, the thickness of lamina 40 is between about 1 and about 10 microns, for example between about 2 and about 5 microns, for example about 4.5 microns.

During relatively high-temperature steps, such as the exfoliation of lamina 40, the portions of cobalt layer 24 in immediate contact with silicon lamina 40 will react to form cobalt silicide. If dielectric layer 28 was included, cobalt silicide is formed where first surface 10 of lamina 40 was exposed in vias 33. If dielectric layer 28 was omitted, in general all of the cobalt of cobalt layer 24 will be consumed, forming a blanket of cobalt silicide.

Second surface 62 has been created by exfoliation. At this point texturing can be created at second surface 62 according to embodiments of the present invention. A standard clean is performed at second surface 62, for example by an HF dip. Following the cleaning step, in some embodiments an oxide layer (not shown) is grown at second surface 62. In most embodiments, this thin oxide layer will be a silicon oxide, generally silicon dioxide. This oxide will be thin, generally about 100 angstroms thick or less, in some embodiments about 50 angstroms or less. The easiest method of forming this oxide is to simply expose second surface 62 to atmosphere at room temperature for a period of, for example, about two hours, allowing a native oxide to form. In alternative embodiments, this oxide may be grown by chemical or thermal methods, or silicon nitride may be grown instead. It is preferred that the oxide layer be of a material harder than the silicon surface. In alternative embodiments, some other suitable material can be deposited on second surface 62, though clearly silicon oxide is most readily provided. In some embodiments, this step may be omitted.

Following growth of the optional oxide layer, and without removing it, a buffing step is carried out at surface 62. Buffing should be performed with a lightly textured material; a suitable material has proven to be textured latex of the type conventionally used in standard unpowdered cleanroom gloves. This buffing step is best performed at very light pressure, for example less than about 0.5 psi. In general it has been found that very few passes over second surface 62 will be adequate, for example one, two, or three passes is preferred. In most embodiments the entire surface will be uniformly buffed. Satisfactory buffing can be achieved by, for example, lightly rubbing a gloved finger over second surface 62. This process can be automated for high-volume production by moving the lamina 40 and receiver element 60 past a stationary buffing material one, two, or more times, in a single direction or in a different direction on each pass. Alternatively, a buffing material can be moved over a stationary lamina-and-receiver-element assemblage, or both buffing material and lamina might move. In most embodiments the entire second surface 62 will be buffed; in general at least 50 percent, usually at least 95 percent, will be buffed.

Following buffing, etching is performed with a crystallographically selective etchant such as KOH, TMAH, or NaOH. As is conventional, a surfactant such as IPA, or some other suitable agent to reduce surface tension, is also included. A satisfactory surface is produced after a relatively short time, for example twelve minutes or less, and etching may be stopped after this time. Depending on etch parameters, etch time may be about ten minutes, eight minutes, or, in some embodiments, as short as five minutes or less. In other embodiments, etch time may be longer. Etching may be performed at relatively low temperature, for example between about 60 and about 80 degrees C., for example about 65 to about 75 degrees C. It may be found that this low temperature makes etching more controllable. The concentration of the surfactant, such as IPA, may be, for example, between 5 and 20 percent. The concentration of TMAH may be varied widely. In one embodiment it is about 2 percent. It is expected that TMAH concentration can be varied widely within conventional ranges to create a satisfactory textured surface, while the TMAH concentration will affect etch rate.

Figure 6D:
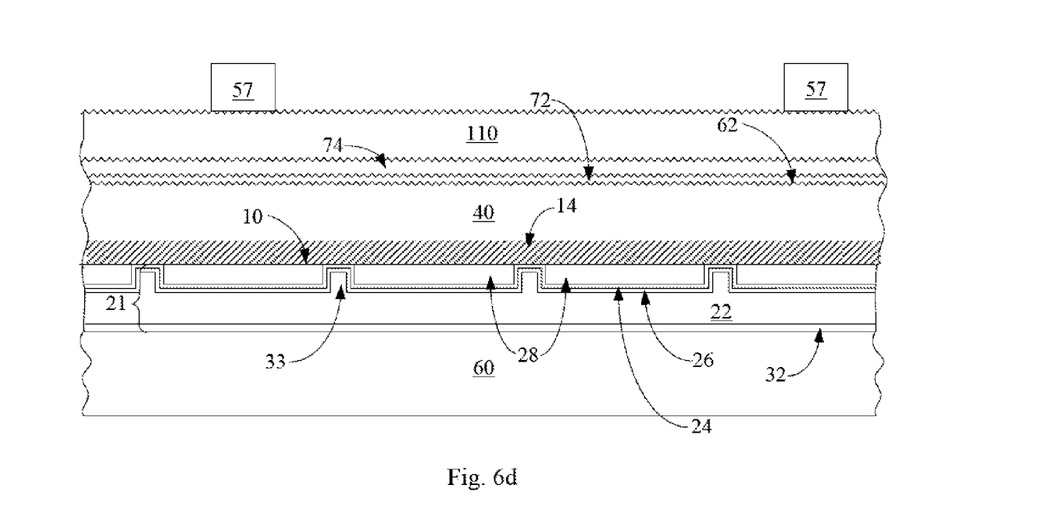

Following etching, second surface 62 will have texture having a peak-to-valley height less than about 1 micron, with average peak-to-peak distance also less than about one micron, shown schematically in FIG. 6d. The oxide layer is removed during the etch. Most often the peak-to-valley height and the average peak-to-peak distance are both about 0.8 micron or less, and may both be about 0.5 micron or less. Very little silicon has been lost at second surface 62 during this etch, typically about 0.3 mg/cm$^2$ or less. Immediately after etching, SEM images have revealed no apparent flat or untextured areas remaining at surface 62. The profile of the texture seems to consist of imperfect or incomplete pyramids. In general all or nearly all of second surface 62 has been textured, for example at least 95 percent, or 50 percent or more. Following etching, the thickness of lamina 40 is generally between about 1 and about 10 microns. This etched surface has relatively low average reflectance for light having wavelength between 375 and 1010 nm, for example about 11 or 12 percent. Note that this texturing etch will generally serve to remove any surface damage caused by exfoliation of lamina 40 from the donor wafer.

In some embodiments, an anneal may be performed to repair damage caused to the crystal lattice throughout the body of lamina 40 during the implant step. Annealing may be performed, for example, at 500 degrees C. or greater, for example at 550, 600, 650, 700 degrees C. or greater, at about 950 degrees C. or more. The structure may be annealed, for example, at about 650 degrees C. for about 45 minutes, or at about 800 degrees for about two minutes, or at about 950 degrees for 60 seconds or less. In other embodiments, no damage anneal is performed.

Note that texturing steps (including optional growth of an oxide, buffing and etching) according to embodiments of the present invention can be performed either before or after the damage anneal, so long as the damage anneal is not performed in between buffing and etching.

Referring again to FIG. 6d, if any native oxide (not shown) has formed on second surface 62 during annealing, it may be removed by any conventional cleaning step, for example by an HF dip. After cleaning, a silicon layer is deposited on second surface 62. This layer 74 includes heavily doped silicon, and may be amorphous, microcrystalline, nanocrystalline, or polycrystalline silicon, or a stack including any combination of these. This layer or stack may have a thickness, for example, between about 50 and about 350 angstroms. FIG. 6d shows an embodiment that includes intrinsic amorphous silicon layer 72 between second surface 62 and doped layer 74. In other embodiments, layer 72 may be omitted. In this example, heavily doped silicon layer 74 is doped p-type, opposite the conductivity type of lightly doped n-type lamina 40, and serves as the emitter of the photovoltaic cell being formed, while lightly doped n-type lamina 40 comprises the base region. If included, layer 72 is sufficiently thin that it does not impede electrical connection between lamina 40 and doped silicon layer 74. Note that in general deposited amorphous silicon is conformal; thus the texture at surface 62 is reproduced at the surfaces of silicon layers 72 and 74.

A transparent conductive oxide (TCO) layer 110 is formed on heavily doped silicon layer 74. Appropriate materials for TCO 110 include indium tin oxide, as well as aluminum-doped zinc oxide, tin oxide, titanium oxide, etc.; this layer may be, for example, about 1000 angstroms thick, and serves as both a top electrode and an antireflective layer. In alternative embodiments, an additional antireflective layer (not shown) may be formed on top of TCO 110.

A photovoltaic cell has been formed, including lightly doped n-type lamina 40, which comprises the base of the cell, and heavily doped p-type amorphous silicon layer 74, which serves as the emitter of the cell. Heavily doped n-type region 14 will improve electrical contact to the cell. Electrical contact must be made to both faces of the cell. This contact can be formed using a variety of methods, including those described in Petti et al., U.S. patent application Ser. No. 12/331,376, "Front Connected Photovoltaic Assembly and Associated Methods," filed Dec. 9, 2008; and Petti et al., U.S. patent application Ser. No. 12/407,064, "Method to Make Electrical Contact to a Bonded Face of a Photovoltaic Cell," filed Mar. 19, 2009, hereinafter the '064 application, both owned by the assignee of the present application and both hereby incorporated by reference. If the methods of the '064 application are employed, for example, gridlines 57 (formed by any suitable method) make electrical contact to heavily doped p-type amorphous silicon layer 74 by way of TCO 110, while contact is made to the base of the cell by way of heavily doped n-type layer 14.

Figure 6E:
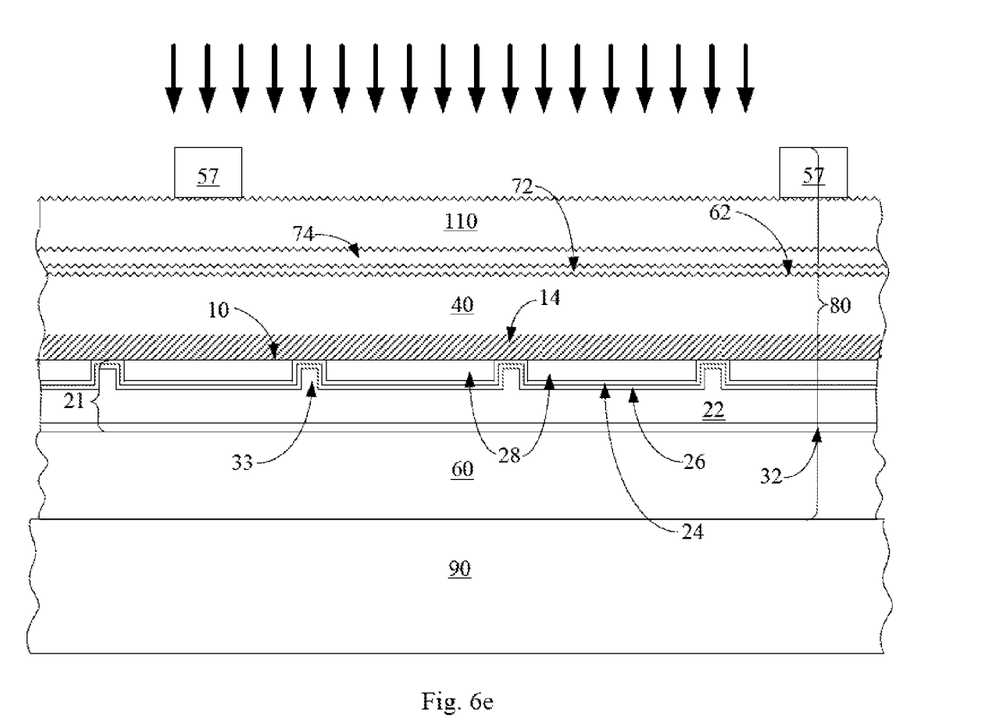

FIG. 6e shows completed photovoltaic assembly 80, which includes a photovoltaic cell and receiver element 60. In alternative embodiments, by changing the dopants used, heavily doped region 14 may serve as the emitter, at first surface 10, while heavily doped silicon layer 74 serves as a contact to the base region. Incident light (indicated by arrows) falls on TCO 110, enters the cell at heavily doped p-type amorphous silicon layer 74, enters lamina 40 at second surface 62, and travels through lamina 40. In this embodiment, receiver element 60 serves as a substrate. If receiver element 60 has, for example, a widest dimension about the same as that of lamina 40, the receiver element 60 and lamina 40, and associated layers, form a photovoltaic assembly 80. Multiple photovoltaic assemblies 80 can be formed and affixed to a supporting substrate 90 or, alternatively, a supporting superstrate (not shown). Additional fabrication details of such a cell are provided in Herner, U.S. patent application Ser. No. 12/540,463, "Intermetal Stack for Use in a Photovoltaic Device," filed Aug. 13, 2009, owned by the assignee of the present application and hereby incorporated by reference.

In the completed photovoltaic cell, in which light-facing surface 62 was textured according to embodiments of the present invention, average reflectance for light having wavelength between 375 and 1010 nm at light-facing surface 62 will be no more than about six percent, generally no more than about five percent, for example about 3.5 percent.

Figure 7:
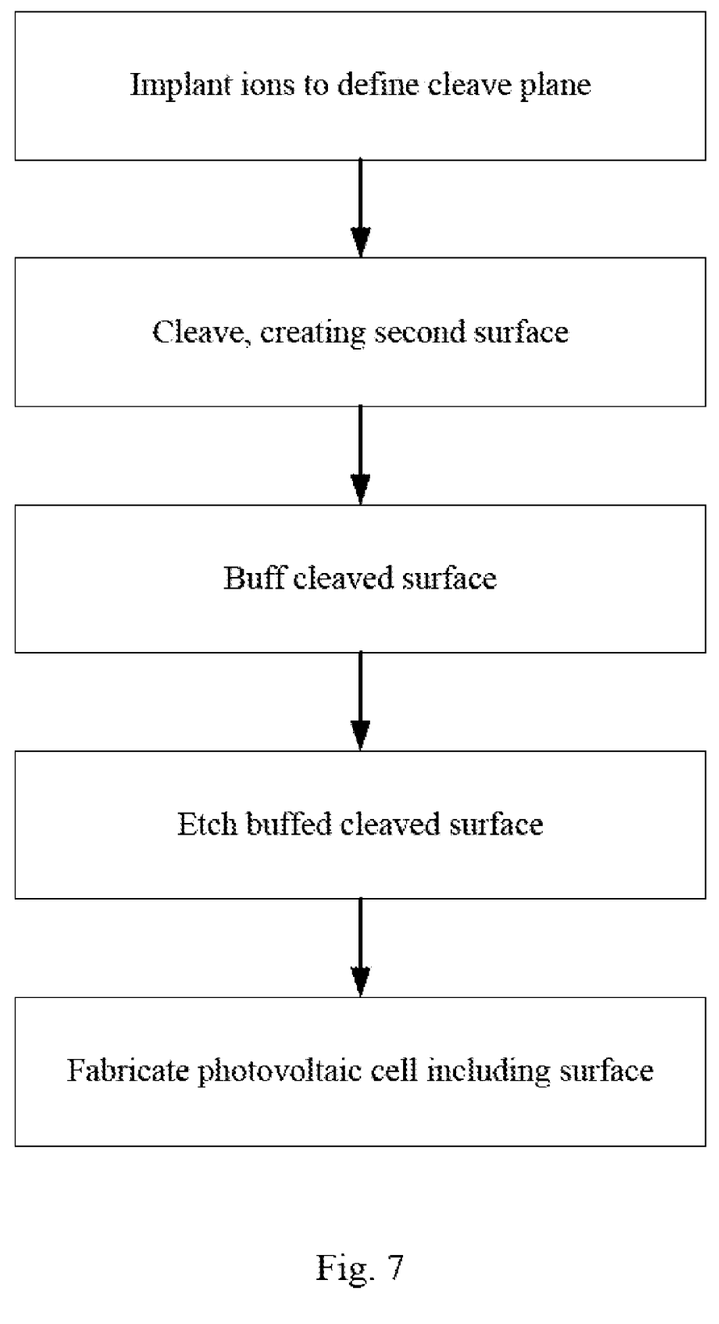
FIG. 7 is a flow chart summarizing steps in a method to create a textured surface according to another embodiment of the present invention.

To summarize, a method to texture a surface of a photovoltaic cell has been described, the method comprising: implanting ions in a silicon body to define a cleave plane; cleaving a silicon lamina from the silicon body at the cleave plane, creating a cleaved surface; buffing the cleaved surface; etching the buffed cleaved surface; and fabricating the photovoltaic cell, wherein the cleaved surface is a light-facing surface in the photovoltaic cell, wherein, after the etching step, at least fifty percent of the light-facing surface has a peak-to-valley height less than about one micron and an average peak-to-peak distance of less than about one micron, and wherein, in the completed photovoltaic cell, average reflectance for light having wavelength between 375 and 1010 nm at the light-facing surface is no more than about five percent. Thickness of the lamina is between about 0.5 micron and about 10 microns. These steps are summarized in FIG. 7.

An example has just been provided in which texturing according to the present invention is performed at the cleaved surface of a thin silicon lamina. This texturing can be performed at other points in the process and in other devices, however.

Figure 8:
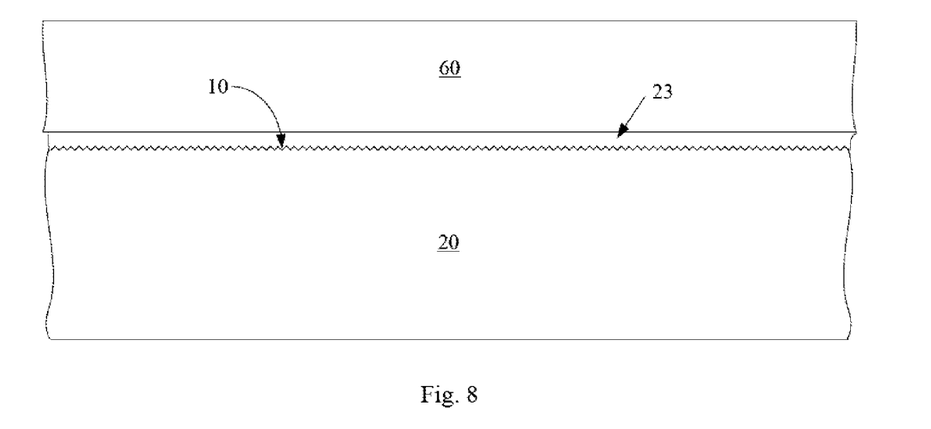
FIG. 8 is a cross-sectional view illustrating fabrication of a photovoltaic cell textured according to another embodiment of the present invention.

For example, referring to FIG. 8, in some embodiments, texturing could be performed at first surface 10 of the donor wafer 20 before bonding or adhering to receiver element 60. An intermetal stack 23 is shown disposed between donor wafer 20 and receiver element 60. The textured surface 10 can be the light-facing surface in the finished device, where receiver element 60 serves as a superstrate; clearly in such an embodiment receiver element 60, and intermetal stack 23, will be formed of transparent materials. Fabrication of a device in which receiver element 60 serves as a superstrate in the completed device is described in Sivaram et al., earlier incorporated. Alternatively, in the completed device, as in the detailed example provided, first surface 10 can be the back surface of the cell. The texturing of the present invention will also provide advantage at this surface. The light-facing surface, created by cleaving, can be textured as well.

In other embodiments, the methods of the present invention can be used to provide texture at the light-facing or back surface, or both, of a photovoltaic cell made by more conventional means from a silicon wafer, for example having thickness of 100, 150, 200 microns or more. Using methods of the present invention, texture providing low reflectance and good refraction can be created with very short etch times, in the range of five to twelve minutes as opposed to the conventional etch times of thirty minutes, one hour, or more. A pristine wafer surface typically has relief of no more than tens of angstroms, for example not exceeding 20 angstroms. Inclusion of the growth of a thin silicon oxide layer before buffing may be particularly useful in producing sub-micron texture according to embodiments of the present invention at such a polished, pristine surface.

A variety of embodiments has been provided for clarity and completeness. Clearly it is impractical to list all possible embodiments. Other embodiments of the invention will be apparent to one of ordinary skill in the art when informed by the present specification. Detailed methods of fabrication have been described herein, but any other methods that form the same structures can be used while the results fall within the scope of the invention.

The foregoing detailed description has described only a few of the many forms that this invention can take. For this reason, this detailed description is intended by way of illustration, and not by way of limitation. It is only the following claims, including all equivalents, which are intended to define the scope of this invention.

What is claimed is:

1. A method to texture a surface of a photovoltaic cell, the method comprising:
   buffing a first surface of a silicon body;
   etching the buffed first surface; and
   fabricating the photovoltaic cell, wherein the first surface is a light-facing surface in the photovoltaic cell,
   wherein, after the etching step, at least fifty percent of the first surface has a peak-to-valley height less than about one micron and an average peak-to-peak distance of less than about one micron, and
   wherein, in the completed photovoltaic cell, average reflectance for light having wavelength between 375 and 1010 nm at the light-facing surface is no more than about five percent.

2. The method of claim 1 wherein, in the completed photovoltaic cell, the silicon body has a thickness between about 0.5 micron and about 10 microns.

3. The method of claim 1 wherein, in the completed photovoltaic cell, the silicon body has a thickness greater than about 100 microns.

4. The method of claim 1 further comprising, before the buffing step, forming a native oxide on the first surface, wherein the native oxide is not removed before the buffing step.

5. The method of claim 4 wherein thickness of the native oxide does not exceed 100 angstroms.

6. The method of claim 4 wherein, before the step of forming a native oxide on the first surface, relief of the first surface does not exceed about 20 angstroms.

7. The method of claim 4 further comprising:
   before the step of forming a native oxide on the first surface, implanting ions in a donor body to define a cleave plane; and
   cleaving the silicon body from the donor body at the cleave plane, wherein the first surface is created by cleaving.

8. The method of claim 1 wherein the silicon body is substantially crystalline silicon.

9. The method of claim 8 wherein the silicon body is monocrystalline silicon.

10. The method of claim 1 wherein the etching step includes etching with a crystallographically selective etchant, and wherein etching with the crystallographically selective etchant takes place for no more than twelve minutes.

11. The method of claim 1 wherein, during the etching step, a total of about 0.3 mg/cm2 of silicon is etched.

12. A method to texture a surface of a photovoltaic cell, the method comprising: implanting ions in a silicon body to define a cleave plane;

cleaving a silicon lamina from the silicon body at the cleave plane, creating a cleaved surface;

buffing the cleaved surface;

etching the buffed cleaved surface; and fabricating the photovoltaic cell, wherein the cleaved surface is a light-facing surface in the photovoltaic cell, wherein, after the etching step, at least fifty percent of the light-facing surface has a peak-to-valley height less than about one micron and an average peak-to-peak distance of less than about one micron, and wherein, in the completed photovoltaic cell, average reflectance for light having wavelength between 375 and 1010 nm at the light-facing surface is no more than about five percent.

13. The method of claim 12 wherein the silicon lamina is monocrystalline silicon.

14. The method of claim 12 further comprising, between the cleaving step and the buffing step, forming a native oxide on the cleaved surface, wherein the native oxide is not removed before the buffing step.

15. The method of claim 14 wherein thickness of the native oxide does not exceed 100 angstroms.

16. The method of claim 12 wherein the lamina comprises the base of the photovoltaic cell.

17. The method of claim 12 wherein at least ninety-five percent of the light-facing surface has a peak-to-valley height less than about one micron and an average peak-to-peak distance of less than about one micron.

18. The method of claim 12 wherein, following the etching step, the lamina has a thickness between about 1 micron and about 10 microns.

19. The method of claim 12 wherein the etching step includes etching with a crystallographically selective etchant, and wherein etching with the crystallographically selective etchant takes place for no more than twelve minutes.

* * * * *

UNITED STATES PATENT AND TRADEMARK OFFICE
CERTIFICATE OF CORRECTION

PATENT NO. : 8,349,626 B2  
APPLICATION NO. : 12/729878  
DATED : January 8, 2013  
INVENTOR(S) : Zhiyong Li et al.

Page 1 of 1

It is certified that error appears in the above-identified patent and that said Letters Patent is hereby corrected as shown below:

On the Title page, at Item (75) Inventors:, please delete "Mohamed H. Hilali" and insert --Mohamed M. Hilali--.

Signed and Sealed this
Fifth Day of March, 2013

Teresa Stanek Rea
*Acting Director of the United States Patent and Trademark Office*